United States Patent
Han et al.

(10) Patent No.: US 12,291,774 B2
(45) Date of Patent: May 6, 2025

(54) GAS BARRIER ALUMINUM DEPOSITION FILM AND PREPARATION METHOD THEREOF

(71) Applicant: TORAY ADVANCED MATERIALS KOREA, INC., Gyeongsangbuk-do (KR)

(72) Inventors: Seung Hun Han, Gyeongsangbuk-do (KR); Kil Joong Kim, Gyeongsangbuk-do (KR); In Seek Chung, Gyeongsangbuk-do (KR)

(73) Assignee: TORAY ADVANCED MATERIALS KOREA, INC., Gyeongsangbuk-do (KR)

( * ) Notice: Subject to any disclaimer, the term of this patent is extended or adjusted under 35 U.S.C. 154(b) by 368 days.

(21) Appl. No.: 17/798,492

(22) PCT Filed: Nov. 5, 2020

(86) PCT No.: PCT/KR2020/015408
§ 371 (c)(1),
(2) Date: Aug. 9, 2022

(87) PCT Pub. No.: WO2021/162203
PCT Pub. Date: Aug. 19, 2021

(65) Prior Publication Data
US 2023/0079166 A1    Mar. 16, 2023

(30) Foreign Application Priority Data
Feb. 12, 2020    (KR) .................. 10-2020-0016713

(51) Int. Cl.
*C23C 16/02*    (2006.01)
*B29C 48/00*    (2019.01)
(Continued)

(52) U.S. Cl.
CPC ...... *C23C 16/0272* (2013.01); *B29C 48/0018* (2019.02); *B29C 48/08* (2019.02);
(Continued)

(58) Field of Classification Search
None
See application file for complete search history.

(56) References Cited

U.S. PATENT DOCUMENTS 7,279,061 B2    10/2007    Francois
2011/0143070 A1    6/2011    Toft et al.
(Continued)

FOREIGN PATENT DOCUMENTS

EP    0484956 A2    5/1992
JP    2000-108262 A    4/2000
(Continued)

OTHER PUBLICATIONS

English translation of Oyama et al. (JP 2016-135614). (Year: 2016).*

(Continued)

*Primary Examiner* — Ronak C Patel
(74) *Attorney, Agent, or Firm* — Harness, Dickey & Pierce, P.L.C.

(57) ABSTRACT

In a gas-barrier aluminum deposition film according to one embodiment of the present invention, a seed coating layer containing functional groups of at least one type selected from among a hydroxyl group (—OH), an amine group (—NH), and a carboxylic acid group (—COOH) is formed on a thermoplastic plastic base film to form a seed molecular layer that enables uniform deposition of aluminum, such as AlOx or AlNx, through chemical reaction, on a surface of the coating layer, with aluminum atoms vaporized at the initial stage of aluminum deposition, thereby inducing uniform deposition of an aluminum layer to be subsequently (Continued)

deposited. Therefore, it is possible to provide a deposited film having superior oxygen and water vapor barrier properties compared to existing aluminum deposition films.

7 Claims, 1 Drawing Sheet

(51) Int. Cl.
  *B29C 48/08* (2019.01)
  *B29C 55/14* (2006.01)
  *C08J 5/18* (2006.01)
  *C23C 16/06* (2006.01)
  *B29K 67/00* (2006.01)
  *B29L 7/00* (2006.01)

(52) U.S. Cl.
  CPC ............... *B29C 55/143* (2013.01); *C08J 5/18* (2013.01); *C23C 16/06* (2013.01); *B29K 2067/003* (2013.01); *B29L 2007/008* (2013.01); *C08J 2367/02* (2013.01)

(56) References Cited

U.S. PATENT DOCUMENTS

| | | | |
|---|---|---|---|
| 2015/0119548 A1* | 4/2015 | Takahashi | B29C 55/12 528/308.2 |
| 2015/0292086 A1 | 10/2015 | Sato et al. | |
| 2015/0344650 A1* | 12/2015 | Ouzineb | C09D 5/002 427/407.1 |
| 2019/0275560 A1 | 9/2019 | Pietsch et al. | |

FOREIGN PATENT DOCUMENTS

| | | | |
|---|---|---|---|
| JP | 2000202969 | A | 7/2000 |
| JP | 2004-168040 | A | 6/2004 |
| JP | 2016-74165 | A | 5/2016 |
| JP | 6413539 | B2 | 10/2018 |
| JP | 2018-538162 | A | 12/2018 |
| KR | 10-2013-0091281 | A | 8/2013 |
| KR | 10-1457613 | B1 | 11/2014 |
| KR | 10-2015-0073980 | A | 7/2015 |

OTHER PUBLICATIONS

English translation of Hinoki et al. (JP 2014-097623). (Year: 2014).*
Extended European Search Report from corresponding European Patent Application No. 20919151.9, dated Feb. 8, 2024.
Charles A. Bishop, et al.: "Metallizing Technical Reference", May 1, 2012, retrieved from the internet, http://www.aimcal.org/uploads/4/6/6/9/46695933/aimcal-metallizing-technical-reference-5thed.pdf.
Office Action from corresponding Chinese Patent Application No. 202080096142.6, dated Sep. 27, 2023.
Examination Report & Search Strategy from corresponding Indian Patent Application No. 202217050907, dated Aug. 22, 2023.
Notice of Reasons for Rejection from corresponding Japanese Patent Application No. 2022-547287, dated Aug. 5, 2023.
International Search Report from corresponding PCT Application No. PCT/KR2020/015408, dated Feb. 2, 2021.
Official Letter & Search Report from corresponding Taiwanese Patent Application No. 109142453, dated Sep. 27, 2021.

* cited by examiner

GAS BARRIER ALUMINUM DEPOSITION FILM AND PREPARATION METHOD THEREOF

CROSS-REFERENCE TO RELATED APPLICATIONS

This application is a national phase application of PCT Application No. PCT/KR2020/015408, filed on Nov. 5, 2020, which claims the benefit and priority to Korean Patent Application No. 10-2020-0016713, filed on Feb. 12, 2020. The entire disclosures of the applications identified in this paragraph are incorporated herein by references.

TECHNICAL FIELD

The present invention relates to a gas-barrier aluminum deposition film, and more particularly, to a gas-barrier aluminum deposition film having excellent oxygen and water vapor barrier properties by forming a coating layer having a seed molecular layer reactive with aluminum, and a manufacturing method thereof.

BACKGROUND ART

Conventionally, aluminum foil has been widely used as an outer layer packaging material for vacuum insulation, such as various food packaging materials including packaging materials for retort food, heat-insulating materials for home appliances, insulation panels for construction materials, and the like. The aluminum foil has excellent gas barrier properties against oxygen or water vapor, and has high light-shielding property and the design feature offered by the metallic luster. However, despite the above-described advantages, aluminum foil has problems of a large environmental load due to aluminum residue generated after incineration, and a large load on an incinerator.

To solve these problems of the aluminum foil, an aluminum deposition film in which aluminum is deposited on a thermoplastic plastic base film using a vacuum deposition method has been developed and used as a replacement for aluminum foil. As an example of such an aluminum deposition film, reference may be made to Korean Patent Publication NO. 10-2004-0087479 that discloses a method of manufacturing a packaging film with aluminum partially deposited thereon, in which an aluminum deposition layer is partially formed on one surface of a transparent plastic film. However, since an aluminum deposition film is generally formed by thin-film deposition with a deposition thickness of several tens of nanometers on a base film, there is a technical/production limitation in depositing a thick film in micrometer units, such as aluminum foil, for improving barrier properties. In addition, when aluminum is deposited on a base film that has not been separately surface-treated or on a conventional base film subjected to corona surface treatment during vacuum deposition, it is difficult to obtain a uniform aluminum deposition layer, and pinholes and cracks are likely to occur in the deposited aluminum layer. When such pinholes and cracks occur in the aluminum deposition layer, barrier properties against gases, such as oxygen and water vapor, are significantly deteriorated compared to the conventional aluminum foil. For this reason, when the aluminum deposition film is used as a food packaging material, deterioration and discoloration of food may occur and hence it is difficult to secure sufficient shelf life, and when used as a heat insulating material, it is difficult to secure sufficient insulating properties.

TECHNICAL PROBLEM

The present invention is conceived to solve the above problems, and an object of the present invention is to provide a gas-barrier aluminum deposition film in which an aluminum deposition layer is formed on a thermoplastic plastic base film and superior oxygen and water vapor barrier properties are provided compared to an existing aluminum deposition film by inducing uniform deposition of an aluminum layer to be deposited, and to provide a manufacturing method thereof.

The aforementioned and other objects and advantages of the invention will become apparent to those skilled in the art from the following description illustrating preferred embodiments of the invention.

TECHNICAL SOLUTION

The above object is accomplished by providing a gas-barrier aluminum deposition film including a thermoplastic plastic base film, a seed coating layer which is laminated on one surface of the thermoplastic plastic base film and has functional groups of at least one type selected from among a hydroxyl group (—OH), an amine group (—NH), and a carboxylic acid group (—COOH), and an aluminum deposition layer deposited on the seed coating layer.

Preferably, the seed coating layer may include $1.0e+5$ to $1.0e+10$ functional groups of at least one type selected from among a hydroxyl group (—OH), an amine group (—NH), and a carboxylic acid group (—COOH) within an area of 300 μm×300 μm.

Preferably, the thermoplastic plastic base film may be a polyethylene terephthalate (PET) film.

Preferably, the thermoplastic plastic base film may have a crystallinity in a range of 40% to 60%.

Preferably, the thermoplastic plastic base film may have an orientation parameter in a range of 0.150 to 0.200.

Preferably, the thermoplastic plastic base film may have a thickness in a range of 5 to 100 μm.

Preferably, the seed coating layer may be coated with a copolymer polyester-based coating composition.

Preferably, an optical density (OD) of the aluminum deposition layer may be in a range of 1.5 to 4.5.

Preferably, a water vapor transmission rate (WVTR) of the gas-barrier aluminum deposition film may be in a range of 0.01 to 0.5 $g/m^2 \cdot 24$ hr.

Preferably, an oxygen transmission rate (OTR) of the gas-barrier aluminum deposition film may be in a range of 0.1 to 1.0 $cc/m^2 \cdot 24$ hr·atm.

Preferably, the seed coating layer may have a thickness in a range of 10 nm to 100 nm.

In addition, the above object is accomplished by providing a method of manufacturing a gas-barrier aluminum deposition film, the method including coating a seed coating layer on one surface of a thermoplastic plastic base film and depositing aluminum on the seed coating layer.

Preferably, the coating of the seed coating layer may include coating the seed coating layer that includes $1.0e+5$ to $1.0e+10$ functional groups of at least one type selected from among a hydroxyl group (—OH), an amine group (—NH), and a carboxylic acid group (—COOH) within an area of 300 μm×300 μm.

Preferably, the coating of the seed coating layer may include preparing a non-stretched sheet by melt-extruding thermoplastic plastic chips and then cooling and solidifying the plastic chips; preparing a uniaxially stretched base film by stretching the non-stretched sheet in a longitudinal direction; preparing a base film which is coated with the seed coating layer by coating a copolymer polyester-based coating composition having functional groups of at least one type selected from among a hydroxyl group (—OH), an amine group (—NH), and a carboxylic acid group (—COOH) on the uniaxially stretched base film; and preparing a biaxially stretched thermoplastic plastic base film coated with the seed coating layer by stretching the base film coated with the seed coating layer in a traverse direction and then performing heat treatment on the stretched base film.

ADVANTAGEOUS EFFECTS

In a gas-barrier aluminum deposition film according to an embodiment of the present invention, a seed coating layer containing functional groups of at least one type selected from among a hydroxyl group (—OH), an amine group (—NH), and a carboxylic acid group (—COOH) is formed on a thermoplastic plastic base film to form a seed molecular layer that enables uniform deposition of aluminum, such as AlOx or AlNx, through chemical reaction, on a surface of the coating layer, with aluminum atoms vaporized at the initial stage of aluminum deposition, thereby inducing uniform deposition of an aluminum layer to be subsequently deposited. Therefore, it is possible to provide a deposited film having superior oxygen and water vapor barrier properties compared to existing aluminum deposition films.

As described above, the gas-barrier aluminum deposition film according to the present invention provides a deposition film having excellent barrier properties against gases, such as oxygen and water vapor, and thus can be used as a barrier film for various food packaging or heat insulating materials.

However, the effects of the present invention are not limited to the aforementioned effects, and other effects, which are not mentioned above, will be apparent to those skilled in the art from the following description.

DETAILED DESCRIPTION

Figure 1:
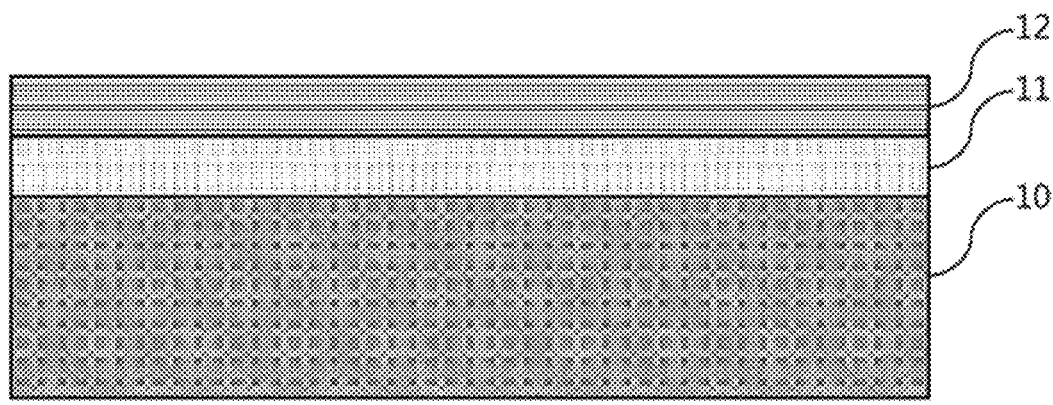
FIG. 1 is a configuration diagram illustrating a gas-barrier aluminum deposition film according to one aspect of the present invention.

Hereinafter, embodiments of the present invention will be described in detail with reference to the accompanying drawings so as to be easily practiced by a person of ordinary skill in the art. It should be understood that the present invention is not to be construed as limited to the embodiments set forth herein and may be embodied in many different forms.

Sizes and thicknesses of elements in the drawings may be exaggerated for convenience of description. Like reference numerals refer to like elements throughout the specification. In addition, it will be understood that when one element such as a layer, a film, a region or a plate is referred to as being "on" another element, the one element may be directly on the another element, and one or more intervening elements may also be present. In contrast, when one element such as a layer, a film, a region or a plate is referred to as being "directly on" another element, one or more intervening elements are not present.

Unless otherwise defined, all terms (including technical and scientific terms) used herein have the same meaning as commonly understood by one of ordinary skill in the art to which this invention belongs. If a term in the present application contradicts or conflicts with a term in the incorporated reference, the term from the present application takes precedence over the conflicting term from the incorporated reference. Although methods and ingredients similar or identical to those described in the present disclosure may be applied to embodiments or tests of the present invention, the present disclosure provides an appropriate method and ingredient.

FIG. 1 is a configuration diagram illustrating a gas-barrier aluminum deposition film according to one aspect of the present invention.

Referring to FIG. 1, a gas-barrier aluminum deposition film according to one aspect of the present invention includes a thermoplastic plastic base film 10, a seed coating layer 11, and an aluminum deposited layer 12. At this time, the seed coating layer 11 laminated on one side of the thermoplastic plastic base film 10 contains at least one or more functional groups selected from among a hydroxyl group (—OH), an amine group (—NH), and a carboxylic acid group (—COOH) which are capable of forming aluminum seeds, such as AlOx or AlNx.

1. Thermoplastic Plastic Base Film 10

In the present invention, the thermoplastic plastic base film 10 includes at least one of thermoplastic plastic films, such as a polyethylene film, a polypropylene film, a polystyrene film, a nylon film, and a polyethylene terephthalate film.

In one embodiment, the thermoplastic plastic base film 10 may be any of the above thermoplastic plastic films, but is preferably a polyethylene terephthalate film. The thermoplastic plastic base film 10 made of polyethylene terephthalate may be a non-stretched film, but a biaxially stretched film is generally preferred because it has excellent mechanical strength and thickness uniformity and is advantageous in terms of barrier properties. In this case, the stretching method may be preferably a sequential biaxial stretching method, which is a method of manufacturing a conventional biaxially stretched polyethylene terephthalate film, in which uniaxial stretching using a roll stretching method and uniaxial stretching using a tenter stretching method are both performed, but it should be noted that any combinations of rolling-stretching, belt stretching, tube stretching, simultaneous biaxial stretching using a tenter stretching method, etc. is used to manufacture the biaxially stretched polyethylene terephthalate film.

In addition, in the case of using a biaxially stretched polyethylene terephthalate film, it is preferable that the longitudinal and transverse stretch ratios of the thermoplastic plastic base film 10 are each more than 2.0 times up to 5.0 times. When the stretch ratio is 2.0 times or less, the mechanical strength is reduced and sufficient thickness uniformity cannot be secured. When the stretch ratio exceeds 5.0 times, breakage frequently occurs during the film forming process due to excessive stretching, resulting in a significant decrease in productivity.

In one embodiment, when a polyethylene terephthalate film is used as the thermoplastic plastic base film 10, it is preferable that the thickness thereof is in a range of 5 μm to 100 μm. When the thickness is less than 5 μm, workability is poor due to low mechanical strength of a barrier packaging material and there is a problem of brittleness in which the film is easily torn by external impact. When the thickness exceeds 100 μm, there is a problem in that the workability for use as barrier packaging is significantly reduced due to the excessive thickness. However, the thickness of the thermoplastic plastic base film 10 is not limited to the aforementioned range, and may be adjusted according to the application and purpose of the gas-barrier aluminum deposition film.

In one embodiment, when a polyethylene terephthalate film is used as the thermoplastic plastic base film 10, it is preferable that the film crystallinity thereof is in a range of 40% up to 60%. When the crystallinity is less than 40%, it is difficult to secure sufficient barrier properties because there are many amorphous areas with relatively weak gas barrier properties. When the crystallinity exceeds 60%, the transparency of the film is reduced due to crystallization or the film is cracked or chipped by external impact, and hence the film is not suitable for use in packaging.

In one embodiment, when a polyethylene terephthalate film is used as the thermoplastic plastic base film 10, it is preferable that an orientation parameter thereof is in a range of 0.150 to 0.200. When the film has the aforementioned orientation parameter, oriented crystals increase and hence the barrier property of the polyethylene terephthalate film may be improved. On the other hand, when the orientation parameter is less than 0.150, the mechanical strength decreases and sufficient thickness uniformity cannot be secured. When the orientation parameter exceeds 0.200, breakage may occur due to excessive stretching during the film manufacturing process and the process stability is significantly reduced.

2. Seed Coating Layer 11

In the present invention, the seed coating layer 11 is formed by being coated on at least one surface of the thermoplastic plastic base film 10.

In one embodiment, the seed coating layer 11 preferably includes at least one from among polyurethane-based, acrylic-based, and copolymer polyester-based coating compositions, and more preferably a copolymer polyester-based coating composition. In this case, it should be noted that either inline coating or offline coating can be selected as a method of forming the seed coating layer 11.

In one embodiment, the copolymer polyester-based coating composition may include functional groups of at least one type selected from among a hydroxyl group (—OH), an amine group (—NH), and a carboxylic acid group (—COOH). Therefore, the seed coating layer 11 preferably has $1.0e+5$ to $1.0e+10$ functional groups of at least one type selected from among a hydroxyl group (—OH), an amine group (—NH), and a carboxylic acid group (—COOH) within an area of 300 μm×300 μm. The functional groups included in the seed coating layer 11 form aluminum and a seed molecular layer of the aluminum deposition layer 12. When the number of functional groups within the area in the seed coating layer 11 is less than $1.0e+5$, a sufficient seed molecular layer cannot be formed and thus the aluminum layer cannot be uniformly deposited, and thereby sufficient gas-barrier properties cannot be achieved. When the number of functional groups exceeds $1.0e+10$, problems such as blocking may occur when a film roll is wound, and coatability of the coating film or the appearance of coating may become poor.

In one embodiment, the thickness of the seed coating layer 11 may be preferably in a range of 10 nm to 100 nm. When the thickness of the seed coating layer 11 is less than 10 nm, the coating layer is susceptible to scratches, or is liable to pinhole defects as some parts of the coating layer are not coated. When the thickness exceeds 100 nm, a problem of poor appearance, such as coating stains arises.

The seed coating layer 11 forms a seed molecular layer that enables uniform deposition of aluminum, such as AlOx or AlNx, by chemically reacting, on a surface of the seed coating layer, with aluminum atoms vaporized at the initial stage of aluminum deposition, so that uniform deposition of aluminum to be subsequently deposited is induced. Accordingly, it is possible to provide a deposited film having superior oxygen and water vapor barrier properties compared to existing aluminum deposition films.

3. Aluminum Deposition Layer 12

The aluminum deposition layer 12 is formed by vapor-depositing aluminum on the seed coating layer 11. By doing so, the gas-barrier aluminum deposition film according to one embodiment has a structure in which the thermoplastic plastic base film 10, the seed coating layer 11, and the aluminum deposition layer 12 are sequentially stacked.

In one embodiment, an optical density OD of the aluminum deposition layer 12 is preferably in a range of 1.5 to 4.5, and more preferably in a range of 2.5 to 3.5. In addition, the thickness of the aluminum deposition layer 12 is preferably in a range of 20 nm to 100 nm, and more preferably in a range of 40 nm to 80 nm.

In this case, when the optical density of the aluminum deposition layer 12 is less than 1.5 or the thickness is less than 20 nm, an aluminum layer imparting barrier properties is too thin to secure sufficient barrier properties, and when the optical density exceeds 4.5 or the thickness exceeds 100 nm, it is difficult to form a uniform aluminum thin film, so that defects such as cracks are liable to occur. Also, when the aluminum deposition layer is deposited as a thick film, a line speed decreases and the amount of aluminum increases, thereby increasing the manufacturing cost.

The aluminum deposition layer 12 may be formed by various methods, for example, sputtering, electron beam evaporation, physical vapor deposition (PVD), chemical vapor deposition (CVD), plasma-enhanced chemical vapor deposition, or plating. In addition, as an example of the aluminum deposition layer 12, a deposited layer with a composition continuously varying from an aluminum oxide layer to an aluminum metal layer may be formed on the seed coating layer 11. The deposited layer with a composition continuously varying from an aluminum oxide layer to an aluminum metal layer refers to a deposited layer having a gradient structure in which an aluminum oxide layer is formed at the initial stage of deposition and is changed to an aluminum metal layer as the film grow.

4. Gas-Barrier Aluminum Deposition Film

The gas-barrier aluminum deposition film in which the thermoplastic plastic base film 10, the seed coating layer 11, and the aluminum deposition layer 12 are sequentially stacked, may have a water vapor transmission rate, preferably, in a range of 0.01 to 0.5 $g/m^2 \cdot 24$ hr, and has an oxygen transmission rate, preferably, in a range of 0.1 to 1.0 $cc/m^2 \cdot 24$ hr·atm. As the water vapor transmission rate and oxygen transmission rate are closer to 0, the barrier property becomes excellent, but in order to achieve the water vapor transmission rate and the oxygen transmission rate less than the above ranges, it is required to deposit the aluminum deposition layer 12 with a deposition thickness of 1 μm or more. However, deposition of a thick film of aluminum with a thickness of 1 μm or more significantly decreases productivity, and the thick aluminum has a problem in that surface defects, such as cracks, occur in the deposited aluminum layer during deposition, which is not preferable. In addition, when the gas transmission rate and oxygen transmission rate exceed the above ranges, sufficient barrier properties cannot be secured when the film is used as a food packaging material, and so there is a problem of deformation and deterioration of food during long-term storage, and when the film is used as a heat insulating material, there is a problem in that it is difficult to achieve a sufficient heat insulating effect.

Figure 2:
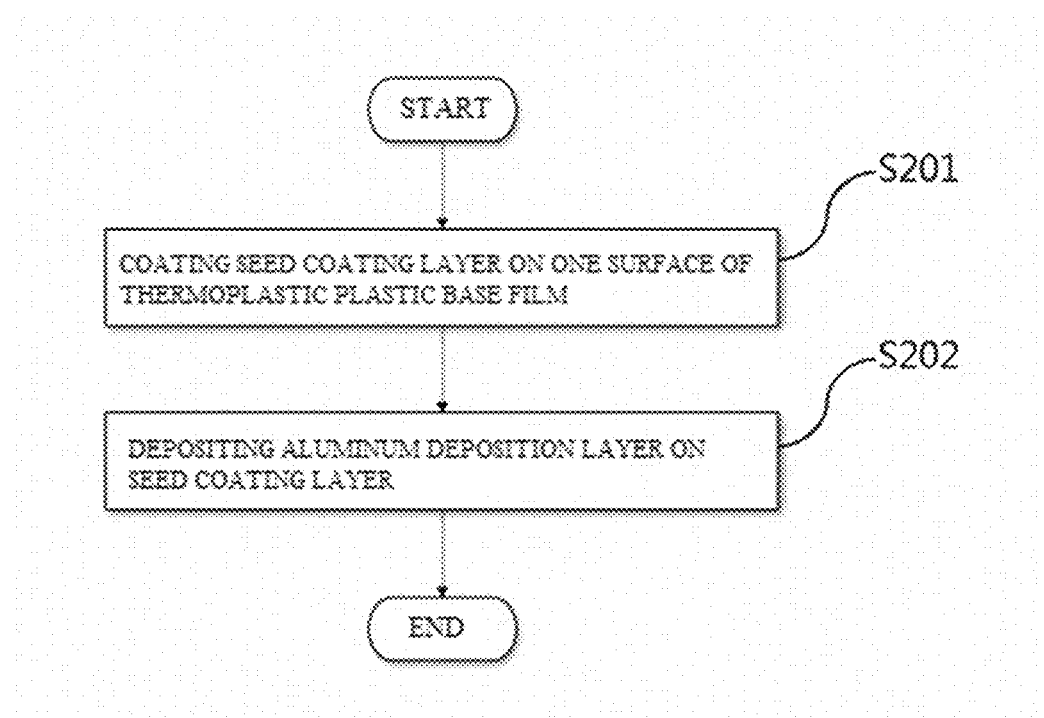
FIG. 2 is a flowchart illustrating a method of manufacturing a gas-barrier aluminum deposition film according to another aspect of the present invention.

FIG. 2 is a flowchart illustrating a method of manufacturing a gas-barrier aluminum deposition film according to another aspect of the present invention.

Referring to FIG. 2, a method of manufacturing a gas-barrier aluminum deposition film according to another aspect of the present invention includes coating a seed coating layer on one surface of a thermoplastic plastic base film (S201) and depositing an aluminum-deposited layer on the seed coating layer (S202).

In operation S201 of coating the seed coating layer on one surface of the thermoplastic plastic base film, a seed coating composition is coated on one surface of the prepared thermoplastic plastic base film through either inline coating or offline coating to form the seed coating layer. At this time, the seed coating composition forming the seed coating layer may include at least one from among polyurethane-based, acrylic-based, and copolymer polyester-based coating compositions, and more preferably a copolymer polyester-based coating composition.

In addition, the operation S201 of coating the seed coating layer is preferably an operation of coating the seed coating layer that includes 1.0e+5 to 1.0e+10 functional groups of at least one type selected from among a hydroxyl group (—OH), an amine group (—NH), and a carboxylic acid group (—COOH) within an area of 300 μm×300 μm. In the present invention, in order to solve the problem of pinholes that occur when an aluminum layer is directly deposited on the thermoplastic plastic base film, the seed coating layer is first formed, and the seed coating layer includes 1.0e+5 to 1.0e+10 functional groups of at least one type selected from among a hydroxyl group (—OH), an amine group (—NH), and a carboxylic acid group (—COOH) within an area of 300 μm×300 μm to form a sufficient seed molecular layer, thereby allowing the aluminum deposition layer to be uniformly deposited.

Then, in operation S202 of depositing the aluminum deposition layer on the seed coating layer, aluminum is deposited on the seed coating layer formed in operation S201 to form the aluminum deposition layer. In this case, the seed coating layer on the thermoplastic plastic base film forms a seed molecular layer that enables uniform deposition of aluminum, such as AlOx or AlNx, by chemically reacting, on a surface of the seed coating layer, with aluminum atoms vaporized at the initial stage of aluminum deposition, so that uniform deposition of aluminum to be subsequently deposited is induced.

In addition, the method of depositing the aluminum deposition layer on the seed coating layer in operation S202 is not particularly limited, and for example, sputtering, electron beam evaporation, physical vapor deposition (PVD), chemical vapor deposition (CVD), plasma-enhanced chemical vapor deposition, plating, or the like may be used.

The gas-barrier aluminum deposition film manufactured by the above-described manufacturing method forms, through the seed coating layer, the seed molecular layer that enables uniform deposition of aluminum, such as AlOx or AlNx, by chemically reacting, on the surface of the coating layer, with aluminum atoms vaporized at the initial stage of aluminum deposition, so that uniform deposition of the aluminum layer to be substantially deposited is induced. Hence, it is possible to provide a deposition film having superior oxygen and water vapor barrier properties compared to the existing aluminum deposition films. As described above, the bas-barrier aluminum deposition film according to the present invention has excellent oxygen and water vapor barrier properties and thus can be used as a barrier film for food packaging or heat insulating materials.

Hereinafter, the present invention will be explained further in detail with examples. The examples are provided to explain the present invention in more detail, and the scope of the present invention is not limited to the examples.

EXAMPLES

Example 1

After moisture was removed from polyethylene terephthalate chips, the polyethylene terephthalate chips were put into an extruder, melt-extruded at 280° C., and cooled and solidified using a T-die and a casting drum to obtain a non-stretched sheet. Thereafter, the non-stretched sheet was stretched 3.5 times in a longitudinal direction at a temperature higher than or equal to the glass transition temperature (Tg), and then on one surface of the resulting sheet, a seed coating layer was formed with a dry thickness of 40 nm by a gravure coating method using a copolymer polyester coating composition (HR-514 by Nippon Synthetic Chemical Industry Co., Ltd.) having carboxylic acid (—COOH) functional groups. Thereafter, the resulting sheet was stretched 3.5 times in a transverse direction at a temperature higher than or equal to the glass transition temperature (Tg). Then, heat treatment at 240° C. was performed to obtain a 12 μm-thick biaxially stretched polyethylene terephthalate base film coated with the seed coating layer (40 nm in thickness).

At this time, as a result of measuring the number of carboxylic acid functional groups on the coated surface of the biaxially stretched polyethylene terephtalate base film coated with the seed coating layer by TOF-SIMS, it was confirmed that the seed coating layer had 3.7e+8 carboxylic acid groups within an area of 300 μm×300 μm.

Thereafter, aluminum was deposited on a top of the seed coating layer of the biaxially stretched polyethylene terephthalate base film through a boat-type physical vapor deposition method so that an optical density (OD) of 3.0 was obtained, and thereby a gas-barrier aluminum deposition film was prepared.

Example 2

A gas-barrier aluminum deposition film was prepared in the same manner as in Example 1, except that a copolymer polyester-based coating composition (WR-980 by Nippon Synthetic Chemical Industry Co., Ltd.) having hydroxyl (—OH) functional groups was used as the coating composition for forming the seed coating layer and the seed coating layer had 5.7e+7 hydroxyl groups within an area of 300 μm×300 μm.

Example 3

A gas-barrier aluminum deposition film was prepared in the same manner as in Example 1 except that a urethane-based coating composition (AP-40F by DIC) having amine (—NH) functional groups was used as the coating composition for forming the seed coating layer and the seed coating layer had 2.9e+8 amine groups within an area of 300 μm×300 μm.

Example 4

A gas-barrier aluminum deposition film was prepared in the same manner as in Example 1 except that the seed coating layer had 1.0e+5 carboxylic acid groups within an area of 300 μm×300 μm.

Example 5

A gas-barrier aluminum deposition film was prepared in the same manner as in Example 1 except that the seed coating layer had 1.0e+10 carboxylic acid groups within an area of 300 μm×300 μm.

Example 6

A gas-barrier aluminum deposition film was prepared in the same manner as in Example 1 except that the optical density of the aluminum deposition layer was 1.5.

Example 7

A gas-barrier aluminum deposition film was prepared in the same manner as in Example 1 except that the optical density of the aluminum deposition layer was 4.5.

Comparative Example 1

A gas-barrier aluminum deposition film was prepared in the same manner as in Example 1 except that aluminum was deposited on an untreated polyethylene terephthalate base film in which a seed coating layer was not formed.

Comparative Example 2

A gas-barrier aluminum deposition film was prepared in the same manner as in Example 1 except that aluminum was deposited on the polyethylene terephthalate film that was subjected to corona treatment instead of the coating treatment for forming the seed coating layer.

Comparative Example 3

A gas-barrier aluminum deposition film was prepared in the same manner as in Example 1 except that the number of functional groups of the carboxylic acid group was 2.4e+4 in an area of 300 μm×300 μm.

Comparative Example 4

A gas-barrier aluminum deposition film was prepared in the same manner as in Example 1 except that the number of carboxylic acid functional groups was 7.1e+11 within an area of 300 μm×300 μm.

Comparative Example 5

A gas-barrier aluminum deposition film was prepared in the same manner as in Example 1 except that the optical density of the aluminum deposition layer was 1.3.

Comparative Example 6

A gas-barrier aluminum deposition film was prepared in the same manner as in Example 1 except that the optical density of the aluminum deposition layer was 5.0.

Comparative Example 7

A gas-barrier aluminum deposition film was prepared in the same manner as in Example 1 except that the biaxially stretched film was prepared without separate heat treatment after being stretched 3.5 times at a temperature higher than or equal to the glass transition temperature (Tg) in the transverse direction.

Comparative Example 8

A gas-barrier aluminum deposition film was prepared in the same manner as in Example 1 except that a longitudinal stretch ratio was reduced to 2.0 times and the transverse stretch ratio was lowered to 2.0 times.

For the deposition films prepared in Examples 1 to 7 and Comparative Examples 1 to 8, physical properties were evaluated through the following experimental examples, and the results are shown in Tables 1 and 2.

Experimental Example (1) Water Vapor Transmission Rate (g/m²·24 hr)

A water vapor transmission rate was measured according to the infrared sensor method described in Annex B of JIS K7129:2008 by using a water vapor transmission rate meter (PERMATRAN W3/31) by Mocon Inc. in the United States under the conditions of a temperature of 40° C. and a humidity of 90% RH.

(2) Oxygen Transmission Rate (cc/m²·24 hr·atm)

An oxygen transmission rate was measured according to the isopiestic method described in JIS K7126-2:2006 by using an oxygen transmission rate meter (OXTRAN 2/20) by Mocon Inc. in the United States under the conditions of a temperature of 23° C. and a humidity of 0% RH.

(3) Optical Density Measurement 10 points at intervals of 5 cm were selected on the deposition film, an optical density was measured with an optical density meter (Gretag Macbeth, iC Film), and an average value was calculated.

(4) Calculation of Crystallinity

A density gradient pipe using sodium bromide solution was prepared and the density of the film was measured at 25° C. Then, the crystallinity was calculated from the measured density d using Equation 1 below.

$$\text{Crystallinity } Xc[\%] = \{dc \times (d-da)\}/\{dx(dc-da)\} \times 100 \quad \text{(Equation 1)}$$

In Equation 1, da denotes amorphous density and dc denotes complete crystalline density. In the case of polyethylene terephthalate, 1.335 g/cm3 is used as the value of da and 1.455 g/cm3 is used as the value of dc.

(5) Calculation of Orientation Parameter (fn)

In accordance with JIS-K7142, measurement was performed using an Abbe refractometer (by ATAGO Co. LTD) at a temperature of 25° C. and at a humidity of 65% RH. Three test pieces, each 25 mm wide and 30 mm long, were cut, and a refractive index of the test pieces was measured for a length direction, a width direction, and a thickness direction of the film, and then averaged to calculate the reflective index for each direction. Then, by using the results, the orientation parameter (fn) was calculated by Equation 2 below.

$$fn=(nMD+nTD)/2-nZD \quad \text{(Equation 2)}$$

nMD: refractive index in the longitudinal direction of the film
nTD: refractive index in the width direction of the film
nZD: refractive index in the thickness direction of the film (6) Measurement of the Number of Functional Groups For a product in which a seed coating layer was formed on a polyethylene terephthalate base film (a product prior to forming an aluminum deposition layer), time-of-flight secondary ion mass spectrometry (ToF-SIMS) was performed on a sample using a nanoTOF II instrument by PHI (Chanhassen, Minnesota, USA) while a $Bi_1+$ primary ion beam was rastered over a 300 μm×300 μm sample target area for 100 seconds at an ion current of 1.01 pA and an ion voltage of 30 keV, and thereby the number of secondary ions was quantified.

(7) Observation of Film Appearance

After the prepared deposition film was wound on a roll, a winding state and the appearance of the film were visually observed to check whether there was any defect.

TABLE 1

|  | Plastic base film | | | | Seed coating layer | | |
| --- | --- | --- | --- | --- | --- | --- | --- |
|  | Material | Thickness (μm) | Crystallinity (%) | Orientation parameter | Coating composition | Functional group Type | Number of functional groups |
| Example 1 | PET | 12 | 51 | 0.165 | Co-polyester | Carboxylic acid group | 3.7e+8 |
| Example 2 | PET | 12 | 51 | 0.164 | Co-polyester | Hydroxyl group | 5.7e+7 |
| Example 3 | PET | 12 | 51 | 0.164 | Urethane | Amine group | 2.9e+8 |
| Example 4 | PET | 12 | 51 | 0.165 | Co-polyester | Carboxylic acid group | 1.0e+5 |
| Example 5 | PET | 12 | 51 | 0.165 | Co-polyester | Carboxylic acid group | 1.0e+10 |
| Example 6 | PET | 12 | 51 | 0.165 | Co-polyester | Carboxylic acid group | 3.7e+8 |
| Example 7 | PET | 12 | 51 | 0.165 | Co-polyester | Carboxylic acid group | 3.7e+8 |
| Comparative Example 1 | PET | 12 | 51 | 0.165 | Non-treated | | |
| Comparative Example 2 | PET | 12 | 51 | 0.165 | Corona treated | | |
| Comparative Example 3 | PET | 12 | 51 | 0.165 | Co-polyester | Carboxylic acid group | 2.4e+4 |
| Comparative Example 4 | PET | 12 | 51 | 0.165 | Co-polyester | Carboxylic acid group | 7.1e+11 |
| Comparative Example 5 | PET | 12 | 51 | 0.165 | Co-polyester | Carboxylic acid group | 3.7e+8 |
| Comparative Example 6 | PET | 12 | 51 | 0.165 | Co-polyester | Carboxylic acid group | 3.7e+8 |
| Comparative Example 7 | PET | 12 | 35 | 0.165 | Co-polyester | Carboxylic acid group | 3.1e+8 |
| Comparative Example 8 | PET | 12 | 42 | 0.135 | Co-polyester | Carboxylic acid group | 4.1e+8 |

TABLE 2

|  | Barrier property | | | |
| --- | --- | --- | --- | --- |
|  | Aluminum deposition layer Optical density | Water vapor transmission rate (g/m² · 24 hr) | Oxygen transmission rate (cc/m² · 24 hr · atm) | Others |
| Example 1 | 3.0 | 0.12 | 0.16 | |
| Example 2 | 3.0 | 0.2 | 0.27 | |
| Example 3 | 3.0 | 0.08 | 0.11 | |
| Example 4 | 3.0 | 0.49 | 0.95 | |
| Example 5 | 3.0 | 0.09 | 0.18 | |
| Example 6 | 1.5 | 0.48 | 0.97 | |
| Example 7 | 4.5 | 0.47 | 0.96 | |
| Comparative Example 1 | 3.0 | 1.5 | 2.42 | |
| Comparative Example 2 | 3.0 | 1.37 | 1.98 | |
| Comparative Example 3 | 3.0 | 0.67 | 1.36 | |

TABLE 2-continued

| | Aluminum deposition layer Optical density | Barrier property | | Others |
| --- | --- | --- | --- | --- |
| | | Water vapor transmission rate (g/m² · 24 hr) | Oxygen transmission rate (cc/m² · 24 hr · atm) | |
| Comparative Example 4 | 3.0 | 0.37 | 0.89 | Poor appearance of deposition layer Blocking in winding |
| Comparative Example 5 | 1.3 | 2.75 | 3.94 | |
| Comparative Example 6 | 5.0 | 1.19 | 1.58 | Cracks on Al layer |
| Comparative Example 7 | 3.0 | 0.92 | 1.34 | Winding failure |
| Comparative Example 8 | 3.0 | 1.24 | 1.69 | Poor thickness uniformity |

As shown in Tables 1 and 2, it can be seen that Examples 1 to 7 satisfying the constitution of the present invention satisfy all of the crystallinity, orientation parameter, water vapor transmission rate, and oxygen transmission rate of the plastic base film and thereby provides an excellent gas-barrier aluminum deposition film.

In contrast, it can be seen that Comparative Example 1, in which the aluminum deposition layer was directly formed on the plastic base film without a seed coating layer, has a high water vapor transmission rate and a high oxygen transmission rate and thus the gas barrier performance is inferior.

In addition, the water vapor transmission rate and the oxygen transmission rate of Comparative Example 2, in which the aluminum deposition layer was formed after corona treatment on the surface of the plastic base film instead of the seed coating layer, are lower than those in Comparative Example 1, but are significantly higher compared to Examples 1 to 7, and hence it can be seen that the gas barrier performance is inferior.

In addition, in Comparative Example 3, in which the number of functional groups in the seed coating layer was insufficient, the seed coating layer could not form a sufficient seed molecular layer and the aluminum deposition layer could not thus be uniformly deposited. Accordingly, it can be seen that the gas barrier performance was degraded due to a higher water vapor transmission rate and a higher oxygen transmission rate compared to Examples 1 to 7. In addition, Comparative Example 4 having an excessive number of functional groups in the seed coating layer has a lower water vapor transmission rate and a lower oxygen transmission rate than those in Comparative Example 3 but winding failure occurred when the prepared deposition film was wound on a roll, and there was a problem of poor appearance of the deposition layer.

In addition, Comparative Example 5 in which the optical density of the aluminum deposition layer is low, has a higher water vapor transmission rate and a higher oxygen transmission rate compared to Examples 1 to 7, and hence it can be seen that the gas barrier performance is inferior. In Comparative Example 6, where the optical density of the aluminum deposition layer is high, as compared to Examples 1 to 7, cracks were generated in the aluminum deposition layer, resulting in the high water vapor transmission rate and high oxygen transmission rate, and thus it can be seen that the gas barrier performance is inferior.

In addition, in Comparative Example 7 using the plastic base film without heat treatment, it was difficult to secure sufficient barrier properties because there are many amorphous regions in which gas barrier properties are relatively weak due to low crystallinity. Also, it was found that winding failure occurred when the film was wound on the roll. In Comparative Example 8 using the plastic base film having the longitudinal and transverse stretch ratios lowered to 2.0 times, it can be confirmed that the orientation parameter is less than 0.150, so that the mechanical strength is reduced and sufficient thickness uniformity cannot be secured.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A gas-barrier aluminum deposition film comprising:
a thermoplastic base film;
a seed coating layer which is laminated on one surface of the thermoplastic base film and includes 1.0e+5 to 1.0e+10 functional groups of at least one type selected from the group consisting of a hydroxyl group (—OH), an amine group (—NH), and a carboxylic acid group (—COOH) within an area of 300 μm×300 μm; an aluminum deposition layer deposited on the seed coating layer; and wherein the seed coating layer is coated with a copolymer polyester-based coating composition, wherein a water vapor transmission rate (WVTR) of the gas-barrier aluminum deposition film is in a range of 0.01 to 0.5 g/m²·24 hr, and wherein an oxygen transmission rate (OTR) of the gas-barrier aluminum deposition film is in a range of 0.1 to 1.0 cc/m²·24 hr·atm.

2. The gas-barrier aluminum deposition film of claim 1, wherein the thermoplastic base film is a polyethylene terephthalate (PET) film.

3. The gas-barrier aluminum deposition film of claim 1, wherein the thermoplastic base film has a crystallinity in a range of 40% to 60%.

4. The gas-barrier aluminum deposition film of claim 1, wherein the thermoplastic base film has an orientation parameter in a range of 0.150 to 0.200.

5. The gas-barrier aluminum deposition film of claim 1, wherein the thermoplastic base film has a thickness in a range of 5 to 100 μm.

6. The gas-barrier aluminum deposition film of claim 1, wherein an optical density (OD) of the aluminum deposition layer is in a range of 1.5 to 4.5.

7. The gas-barrier aluminum deposition film of claim 1, wherein the seed coating layer has a thickness in a range of 10 nm to 100 nm.

\* \* \* \* \*